United States Patent [19]
Bond et al.

[11] Patent Number: 5,724,728
[45] Date of Patent: Mar. 10, 1998

[54] METHOD OF MOUNTING AN INTEGRATED CIRCUIT TO A MOUNTING SURFACE

[75] Inventors: Robert H. Bond, Plano; Harry M. Siegel, Hurst, both of Tex.

[73] Assignee: SGS-Thomson Microelectronics, Inc., Carrollton, Tex.

[21] Appl. No.: 552,917

[22] Filed: Nov. 3, 1995

Related U.S. Application Data

[62] Division of Ser. No. 346,499, Nov. 29, 1994, Pat. No. 5,642,265.

[51] Int. Cl.$^6$ ............................................. H05K 3/34
[52] U.S. Cl. ........................ 29/840; 257/678; 437/214; 439/73
[58] Field of Search ............................ 228/20.1, 49.5, 228/212, 62; 29/840; 257/678; 437/214; 439/73

[56] References Cited

U.S. PATENT DOCUMENTS

| | | |
|---|---|---|
| 4,805,827 | 2/1989 | Coffman et al. . |
| 4,828,162 | 5/1989 | Donner et al. . |
| 5,172,303 | 12/1992 | Bernardoni et al. ............... 361/744 |
| 5,222,014 | 6/1993 | Lin ................................... 361/744 |
| 5,222,649 | 6/1993 | Funari et al. . |
| 5,403,782 | 4/1995 | Dixon et al. ...................... 437/209 |
| 5,411,400 | 5/1995 | Subrahmanyan et al. ........... 439/68 |
| 5,528,463 | 6/1996 | McLennan et al. ................ 361/772 |
| 5,570,273 | 10/1996 | Siegel et al. ...................... 361/807 |

*Primary Examiner*—Carl J. Arbes
*Attorney, Agent, or Firm*—Theodore E. Galanthay; Lisa K. Jorgenson; Christopher F. Regan

[57] ABSTRACT

A system for packaging integrated circuit components including a ball grid array substrate with a plurality of solder balls coupled to the substrate. A semiconductor device is mounted on the substrate and electrically coupled to the solder balls. One or more terminals are coupled to the substrate and electrically coupled to said semiconductor device. A detachable module contains auxiliary component. The module comprises a body portion for containing the component and one or more electrical connectors for mating with respective terminals to hold the module to the substrate and to electrically couple the component with the semiconductor device. The terminals may also be connected to the solder balls such that a component may be optionally provided either on the circuit board or in the detachable module.

6 Claims, 2 Drawing Sheets

METHOD OF MOUNTING AN INTEGRATED CIRCUIT TO A MOUNTING SURFACE

CROSS-REFERENCE TO OTHER APPLICATIONS

This application is a divisional of U.S. application Ser. No. 08/346,499, filed Nov. 29, 1994, now U.S. Pat. No. 5,642,265; and is related to: U.S. Pat. No. 5,557,504 filed Jun. 21, 1995 which, in turn, is a continuation of U.S. application Ser. No. 08/114,750 filed Aug. 31, 1993 and now abandoned; U.S. Pat. No. 5,570,273 filed Apr. 8, 1994; and U.S. application Ser. No. 08/656,700 filed Jun. 3, 1996 which, in turn, is a continuation of U.S. application Ser. No. 08/346,411 filed Nov. 29, 1994 and now abandoned; all of which are assigned to SGS-Thomson Microelectronics, Inc. and the entire disclosures of which are incorporated herein by reference.

TECHNICAL FIELD OF THE INVENTION

This invention relates in general to semiconductor packaging and more particularly to a ball grid array package and detachable module for interconnection therewith.

BACKGROUND OF THE INVENTION

As the complexity of circuits grows, the need to increase the density of integrated circuits onto a PC (printed circuit) board increases. A major advancement in the field of circuit board technology has been the advent of surface mount technology to attach and connect integrated circuit components onto printed circuit boards. As is known in the art, surface mountable integrated circuit packages allow connection of a package to a planar surface of a circuit board without the need for plated-through holes in the circuit board. Surface mount technology thus increases the theoretical component density of the circuit board, as well as the degrees of freedom available to the board designer, as the location of integrated circuit leads need only be considered for a single surface plane of a multi-layer circuit board, rather than for all planes of the board.

To meet the challenge of increased density of integrated circuits on a PC board, the BGA (ball grid array) integrated circuit package type has become popular in the field. Conventional BGA packages are similar in layout and arrangement to the PGA (pin grid array) packages, in providing an array of connections on the underside of the integrated circuitry packages. Instead of the pin connectors used in PGA packages, however, BGA packages utilize a solder ball located at each connector location. As is known in the art, the BGA package is attached to a printed circuit board by reflowing the solder balls to make connection to conductors at the surface of the printed circuit board. The BGA package provides the important advantage of being self-aligning, as the surface tension of the solder will tend to pull the BGA package into proper alignment with the corresponding conductors on the printed circuit board.

For background purposes, BGA packages of various types are known in the art, including those of "cavity-up" and "cavity-down" types. Conventional cavity-up BGA packages mount the integrated circuit chip face-up into a cavity (or onto the surface) of the package substrate, attach wire bonds between the package and the chip on this tip side, and then either transfer mold or otherwise dispense a plastic over the chip and bond wires to provide environmental protection to the chip and wires. The solder balls are provided on the side of the substrate opposite the chip, and the packaged chip is then mounted to the system printed circuit board. Conventional cavity-down integrated circuit packages mount the integrated circuit chip into the cavity of, or onto the surface of, the substrate, followed by attachment of bond wires thereto and molding of the plastic around the chip. In this type of package, the solder balls are provided on the same side of the substrate as the chip, so that the chip is disposed upside-down after attachment of the packaged chip to the circuit board.

A major disadvantage of using BGA packages is the amount of thermal and mechanical stress exerted on the package during the assembly procedure, relative to non-surface-mountable packages, such as dual in-line (DIP) and similar packages. The mounting of a dual-in-line integrated circuit package to a circuit board is accomplished by wave solder of the underside of the circuit board as the pins of the integrated circuit package extend through plated-through holes in the circuit board. Accordingly, the circuit board itself insulates the integrated circuit package body from the high solder temperatures and harsh chemicals to which the soldered lead tips are subjected. Since the leads of a BGA package are soldered at the same surface of the printed circuit board as the package, however, the BGA package and its contents are directly subjected to the high temperature and to harsh chemicals used in the soldering process, such as flux, solder and cleaning solvents.

While the semiconductor device encapsulated within the BGA package are typically able to withstand the environmental stresses of the surface mounting process, other components which may be part of the package may not be sufficiently tolerant. In particular, the use of battery power for many electronic circuit functions has become available, primarily due to advances made in complementary metal-oxide-semiconductor (CMOS) fabrications and design technology. As is well known, CMOS integrated circuits are able to operate with extremely low active power requirements; in the case of CMOS memory devices, such as static random access memories (SRAMs), the power requirements for data retention are especially low. These low power requirements allow operation and data retention in electronic systems to be powered by conventional lithium batteries and other cell types, improving the portability and reliability of a modern, without the need for a backup power supply on the system board itself. Unfortunately, conventional batteries are unable to reliably withstand the temperatures and chemical conditions to which an integrated circuit is subjected during surface mount assembly. Some types of batteries can be irreparably damaged by exposure to temperatures as low as 181 degrees Centigrade, which is below the temperature of certain solder used in the surface mount process. Other components, such as quartz crystal resonators used in connection with on-chip oscillators, are also vulnerable to these harsh environmental conditions.

In a "gull wing" surface mountable package, use of a removable module which attaches to the package has been proposed in U.S. application Ser. No. 08/114,750, entitled "Surface Mountable Integrated Circuit Package With Detachable Module" to Siegel et al. filed Aug. 31, 1993 and U.S. application Ser. No. 08/225,227, entitled "Surface Mountable Integrated Circuit Package With Low-Profile Detachable Module", to Siegel et al, filed Apr. 8, 1994, both assigned to SGS-Thomson Microelectronics, Inc. and incorporated by reference herein. BGA, however, typically have very little clearance above the system PC board to allow the use mechanical connecting means of the type described.

While the use of BGA package types is desirable for a number of reasons, the use of current BGA package types precludes the used of certain devices in the package, such as batteries and resonators. Therefore, a need has arisen in the industry for a BGA package which supports the use of components which cannot withstand the environmental stress of surface mounting processes.

SUMMARY OF THE INVENTION

The present invention provides a system for packaging integrated circuit components including a ball grid array substrate with a plurality of solder balls coupled to the substrate. A semiconductor device is mounted on the substrate and electrically coupled to the solder balls. One or more terminals are coupled to the substrate and electrically coupled to said semiconductor device. A detachable module contains one or more auxiliary components. The module comprises a body portion for containing the components and one or more electrical connectors for mating with respective terminals to hold the module to the substrate and to electrically couple the components with the semiconductor device.

The present invention provides significant advantages over the prior art. First, the present invention allows a ball grid array package to be mounted to a printed circuit board without subjecting certain components to the stress of a surface mount process. Further, in one embodiment, the electrical connections between the module and the substrate can also serve as the mechanical means for securing the module and the substrate. In another embodiment, the module may be coupled to solder balls on the substrate, such that when the package is coupled to the printed circuit board, the module can be optionally used, depending upon whether the a component is available on the board.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1A:
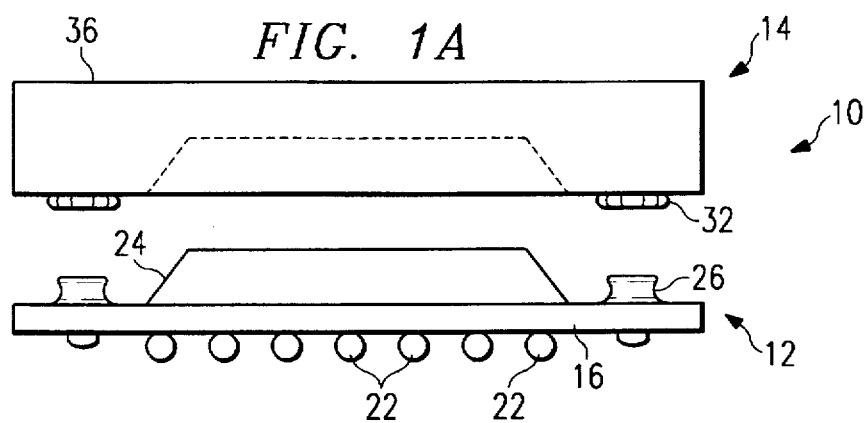
FIGS. 1a and 1b illustrate a front and cross sectional views of a preferred embodiment of a ball grid array package incorporating a detachable module.
Figure 1B:
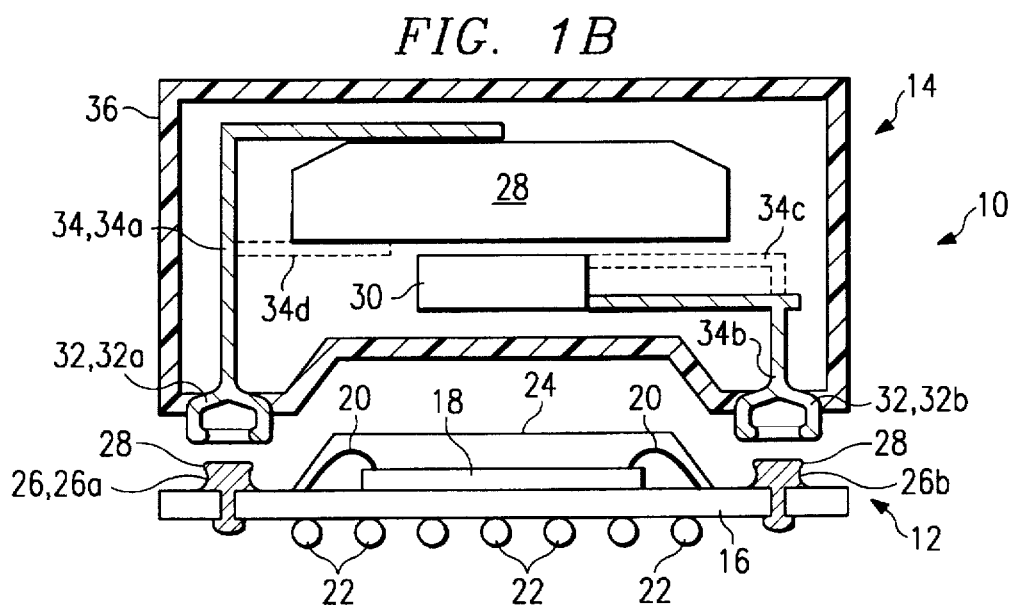

Referring to FIGS. 1a and 1b, front and cross sectional views of a ball grid array package having a detachable module are shown. The overall package 10 is designed for incorporation in a printed circuit board using standard techniques. The package 10 includes a lower module 12 and a upper module 14. The lower module 12 includes the substrate 16, which has an semiconductor chip 18 attached thereto using conventional die attach techniques, such as conductive epoxy or eutectic mounts. The semiconductor chip 18 (hereinafter "chip" 18) may be a solid-state integrated circuit such as a microprocessor, memory, logic device, analog device, or other electronic function implemented in a single-chip or multiple-chip integrated circuit, as is known in the art. The integrated circuit is coupled to the substrate using bond wires 20.

Substrate 16 may be a ceramic substrate, printed circuit board, or other similar substrate having a conducting interconnect system formed thereon or therewithin for carrying electrical signals to and from chip 18. The bond wires 20 connect bond pads on the chip 18 to the conducting interconnect system on the substrate. The conducting interconnect system is coupled to the solder balls 22 on the lower surface of substrate 16 on the lower surface of substrate 16. The solder balls 22 may be formed using conventional techniques, for example by way of a solder mask. The chip 18 and bond wires 20 are covered by encapsulant 24, which may be for example, a plastic mold compound, epoxy, potting compound or other conventional integrated circuit encapsulant.

Figure 2:
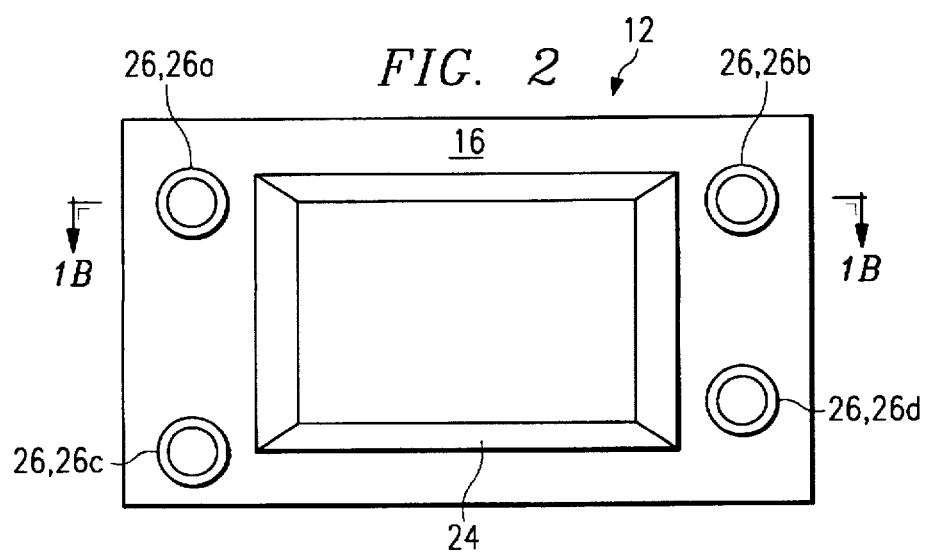
FIG. 2 illustrates a top view of the ball grid array substrate with an encapsulated semiconductor device.

Connectors 26a–26d (referred to generally as connectors 26) are disposed on the substrate 16 to couple the upper module 14 to the lower module 12 (se also FIG. 2). In the preferred embodiment, connectors 26 perform both the mechanical connection, to firmly attach upper module 14 to lower module 12, and the electrical connection, to couple components in the upper module 14 to the chip 18. As illustrated in FIG. 1b, the connectors 26 have a flanged rim portion 28 upon which a cooperating connector may be disposed. The cooperation of the connectors are shown in greater detail in connection with FIGS. 4a and 4b. As shown in FIG. 1b, the connectors 26 are disposed through substrate 16, where they are coupled to the interconnect structure of the substrate (shown in greater detail in FIGS. 3a and 3b). Alternatively, the connectors could be coupled to the interconnect structure of the substrate on the top surface or at an intermediate level, where the substrate is multi-layered.

The upper module 14 contains modules which are either replaceable, subject to failure due to thermal and mechanical stress exerted on the package during the assembly procedure, or both. For example, the upper module 14 shown in FIG. 1b contains a battery 28 and a resonator 30. Connectors 32a–32d connect to corresponding connectors 26a–26d to form mechanical and electrical connections. Lead tabs 34a and 34d are coupled between the battery 28 and respective connectors 32a and 32d. Lead tabs 34b and 34c are coupled between the resonator and respective connectors 32c and 32c. The battery 28, resonator 30, connectors 32 and lead tabs 34 are housed within body 36.

The package 10 will normally be attached to a printed circuit board as follows. First, lower module 12 will be mounted to the circuit board by surface mounting or other conventional method, along with the other integrated circuits which populate the circuit board. After performing the surface mount, using as vapor phase reflow, convection, IR (infra-red) heating or other suitable technique, the upper module 14 is then connected to the lower module 12 through respective connectors 26 and 32, which form a physical and an electrical connection between the two modules.

Accordingly, the contents of upper module 14 are not exposed to solder, flux, solvents and temperature extremes during the surface mount process, as is lower module 12. As a result, the reliability of the contents of the upper module 14 will not be degraded by the surface mount process. Additionally, the upper module 14 may be easily replaced as necessary by pulling upper module 14 from lower module 12 to disengage connectors 26 and 32. Replacement of the upper module 14 can thus be accomplished without requiring the removal of the package 10 from the circuit board to which it is attached. This aspect of the invention is particularly useful where the upper module 14 contains a battery. Also, if the circuit board requires additional soldering, such as for board repair, the upper module can be removed and then replaced after the soldering is finished.

Figure 3A:
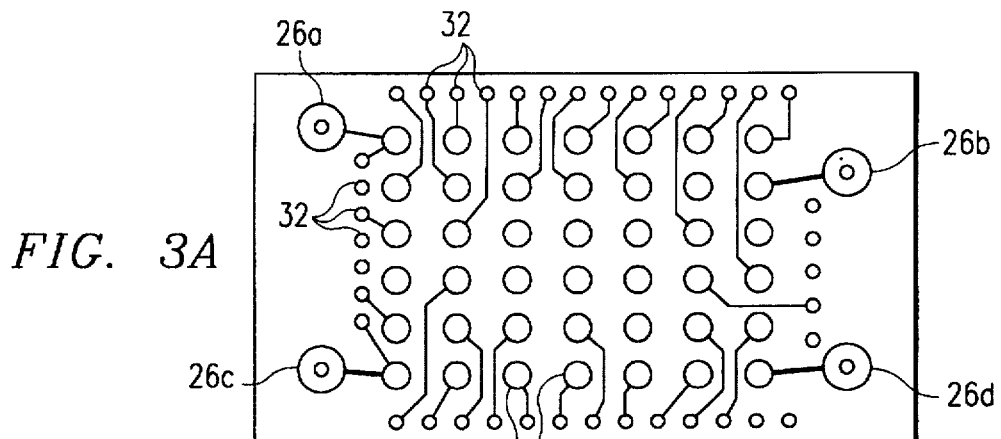
FIGS. 3a and 3b illustrate a bottom views of the ball grid array substrate of FIG. 2.
Figure 3B:
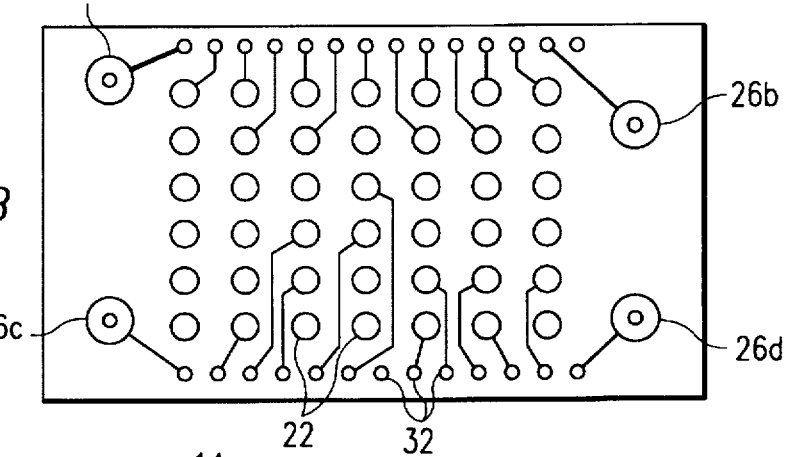

FIGS. 3a and 3b illustrate a first and second embodiments of the electrical connections between the connectors 26 and the solder balls 22, which will form the electrical connections to the circuit board after soldering. In FIG. 3a, at least some of the connectors 26 are electrically coupled to the solder balls 22. While the connection between the connectors 26 and the solder balls 22 is shown in FIG. 3a as a direct connection on the bottom surface of substrate 16, the connection could be made at any layer (or layers) of a multi-layer substrate. FIG. 3a also shows connections between the solder balls 22 and pads 38 which are electrically coupled to the bond wires 20.

This embodiment has the advantage that a circuit board designer has flexibility in designing a circuit board which may or may not contain one or more of the components which may be housed in upper module 14. If the designer decides to incorporate the components (i.e., the battery and/or resonator) on the circuit board, then the upper module 14 is not necessary. In this case, the lower module 12 can be mounted to the circuit board as described above; thus, the lower module 12 serves as both a stand alone circuit package and as a package which can be connected to auxiliary components, such as the battery and resonator. Multiple upper modules could be provided, such that the designer could incorporate either the battery or resonator on the board and purchase an upper module 14 with only the needed component.

Figure 5:
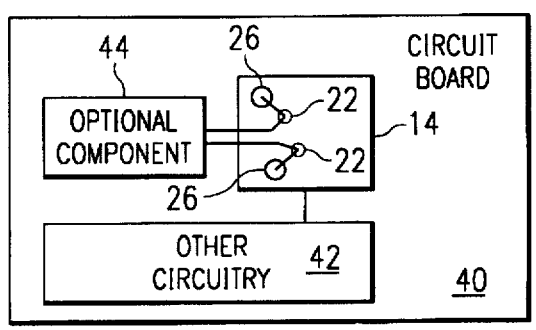
FIG. 5 illustrates use of the ball grid array package having connections as shown in FIG. 3b with a circuit board.

FIG. 5 illustrates a block diagram of this aspect of the preferred embodiment. The lower module 12 is mounted on a circuit board 40 along with other circuitry 42. An optional component 44, for example an on-board rechargeable battery, may be incorporated into the circuit board 40. Assuming that the upper module 14 normally coupled to the chip on the lower module 12 contains only a battery, then the upper module 14 would not be needed if the rechargeable battery was not on the circuit board. On the other hand, if the optional component 44 was not designed into the circuit board 40, the battery could be supplied to the chip on the lower module 12 through use of a upper module housing a battery.

This aspect of the invention is particularly useful in conjunction with semiconductor products which may be used in a number of application. For example, it may be desirable to have a package 10 of the type shown in FIG. 1 wherein the chip 18 is a static ram (SRAM) and the upper module 14 contains a battery so that the SRAM retains information during when power is shut off to the circuit board. The same lower module 12 can be used in situations where (1) on-chip power is desirable, (2) where the SRAM can be powered by an on-board backup battery during system power-off situations and (3) where battery backup is not needed. By providing a package which serves all three functions, the cost of designing multiple products is eliminated.

FIG. 3b illustrates a second embodiment where the components in the upper module 14 are connected to the chip 18 through pads 32, but do not have electrical connections to the circuit board.

Figure 4A:
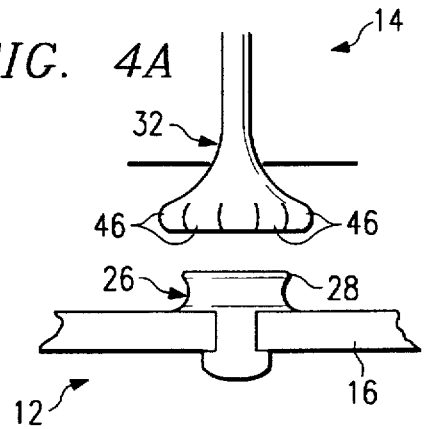
FIGS. 4a and 4b illustrate alternative embodiments for electrically and physically coupling the detachable module to the substrate.
Figure 4B:
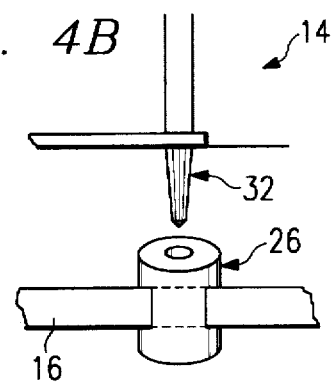

FIGS. 4a and 4b illustrate different embodiments for the connectors 26 and 32. In FIG. 4a, connector 26 comprises a metal male connector having a flange 28 disposed on the top. Connector 32 comprises a circular member having a plurality of spring arms 46 which deflect outwardly when pressed against flange 28 and return inwardly once the flange is within the spring arms 46. This connector is similar to the connectors commonly used on a 9-volt battery.

FIG. 4b illustrates an embodiment wherein connector 26 is a metal female connector which cooperates with pin connectors 32. The pin connectors 32 are designed such that when pressed into female connectors 26, they are held in place by friction. This can be accomplished, for example by using ribbed (or otherwise textured) pin connectors 32 or by using solid pins 32 and a socket 26 which hold the pins therein, such as by springs, internally formed finger (which interlock with corresponding detents in the pins 32), or other suitable sockets 26. In most circumstances, the friction will maintain the physical connection between the upper and lower modules.

The embodiments shown in FIGS. 4a and 4b allow the upper module 14 and lower modules 12 to mated without requiring mechanical clips or similar devices to hold the modules together. This is particularly useful in a BGA design where the clearance between the circuit board and the substrate 16 is minimal.

Although the Detailed Description of the invention has been directed to certain exemplary embodiments, various modifications of these embodiments, as well as alternative embodiments, will be suggested to those skilled in the art. For example, different components from those shown could be housed in the upper module 14. Further, connectors of various configurations could be used to couple the upper module 14 to the lower module 12. Other connector schemes using mechanical connectors to hold the upper module 14 to the lower module 12 are shown in U.S. Pat. No. 5,557,504 and U.S. Pat. No. 5,570,273, referenced above.

The invention encompasses any modifications or alternative embodiments that fall within the scope of the claims.

What is claimed is:

1. A method of mounting an integrated circuit to a printed circuit board, the method comprising the steps of:

mounting a ball grid array substrate having a semiconductor device attached thereto onto a printed circuit board; and attaching a module having a non-ball grid array substrate and containing an auxiliary component to said ball grid array substrate such that terminals on said ball grid array substrate and connectors on the module provide both physical and electrical connections.

2. The method of claim 1 wherein said attaching step comprises the step of attaching a module containing a battery to said ball grid array substrate such that terminals on said ball grid array substrate and connectors on the module provide both physical and electrical connections.

3. The method of claim 1 wherein said attaching step comprises the step of attaching a module containing a resonator to said ball grid array substrate such that terminals on said ball grid array substrate and connectors on the module provide both physical and electrical connections.

4. A method of mounting an integrated circuit to a printed circuit board, the method comprising the steps of:

mounting a ball grid array subsurals having a semiconductor device attached thereto onto a printed circuit board; and detachably connecting a module having a non-ball grid array substrate and containing at least one auxiliary component to the ball grid array substrate such that terminals on the ball grid array substrate and connectors on the module provide both physical and electrical connections.

5. A method as defined in claim 4, wherein said attaching step includes the step of detachably connecting at least one auxiliary component to the module.

6. A method as defined in claim 5, further comprising detachably disconnecting the module from the ball grid array substrate and detachably disconnecting the at least one auxiliary component from the module.

\* \* \* \* \*